United States Patent [19]

Handa

[11] Patent Number: 4,776,661
[45] Date of Patent: Oct. 11, 1988

[54] INTEGRATED OPTICAL DEVICE

[75] Inventor: Yuichi Handa, Atsugi, Japan

[73] Assignee: Canon Kabushiki Kaisha, Tokyo, Japan

[21] Appl. No.: 930,250

[22] Filed: Nov. 13, 1986

[30] Foreign Application Priority Data

Nov. 25, 1985 [JP] Japan .................................. 60-262654
Nov. 25, 1985 [JP] Japan .................................. 60-262655

[51] Int. Cl.⁴ ............................ G02B 6/34; G02B 6/10
[52] U.S. Cl. .............................. 350/96.19; 350/96.12; 350/96.13
[58] Field of Search ............... 350/96.11, 96.12, 96.13, 350/96.14, 96.19

[56] References Cited

U.S. PATENT DOCUMENTS

| | | | |
|---|---|---|---|
| 3,753,157 | 8/1973 | Ash et al. | 350/96.13 X |
| 3,908,121 | 9/1975 | Riseberg et al. | 350/96.13 X |
| 3,990,780 | 11/1976 | Dakss | 350/96.13 |
| 4,369,202 | 1/1983 | Verber et al. | 427/8 |
| 4,394,060 | 7/1983 | Verber et al. | 350/96.11 |
| 4,425,023 | 10/1984 | Matsumoto et al. | 350/96.14 |
| 4,453,801 | 6/1984 | Verber et al. | 350/96.11 |
| 4,455,063 | 6/1984 | Wood et al. | 350/96.12 |
| 4,455,064 | 6/1984 | Kenan | 350/96.13 |
| 4,470,661 | 9/1984 | Matsumoto | 350/96.13 |
| 4,523,803 | 6/1985 | Arao et al. | 350/96.13 |
| 4,637,684 | 1/1987 | Tomita et al. | 350/96.19 |
| 4,693,548 | 9/1987 | Tsunoi | 350/96.13 |
| 4,707,059 | 11/1987 | Ogura et al. | 350/96.14 |

OTHER PUBLICATIONS

Journal of the Optical Society of America, vol. 63, Number 11, Nov. 1973.
SPIE vol. 139 Guided Wave Optical Systems and Devices (1978) High-Brightness Lasers Using Integrated Optics.

Primary Examiner—Eugene R. LaRoche
Assistant Examiner—Steven J. Mottola
Attorney, Agent, or Firm—Fitzpatrick, Cella, Harper & Scinto

[57] ABSTRACT

An integrated optical device for performing optical data processing in an integrated arrangement using an optical waveguide comprises a substrate, a slab optical waveguide provided on the substrate, a channel optical waveguide provided at a portion of the slab optical waveguide, and a grating coupler provided with a grating structure at a portion of the channel optical waveguide to optically couple the slab optical waveguide and the channel optical waveguide.

28 Claims, 12 Drawing Sheets

INPUT RF SIGNAL

INPUT RF SIGNAL

4,776,661

INTEGRATED OPTICAL DEVICE

BACKGROUND OF THE INVENTION

1. Field of the Invention

The present invention relates to an integrated optical device which performs optical data processing in an integrated arrangement using an optical waveguide, and, more particularly, to an integrated optical device which is suitable for use in a wavelength wave divider and an optical spectrum analyzer.

2. Description of the Prior Art

In recent years, research has been actively carried out on integrated optical devices which optically perform modulation, deflection, switching, arithmetic processing, and the like in a compact arrangement using an optical waveguide. In such devices, there is an interaction between a light beam guided through a slab optical waveguide and a surface acoustic wave. In such cases, the guided light beam is preferably a parallel light beam and the slab optical waveguide functions to confine the light solely in a direction perpendicular to the surface of a substrate which forms the waveguide. Such a waveguide is also called a two-dimensional optical waveguide or a planar optical waveguide.

To obtain a parallel light beam in a conventional integrated optical device, an arrangement such as that shown in FIG. 1 has been employed. In the Figure, reference numeral 2 denotes a substrate, while reference numeral 4 denotes a slab optical waveguide formed on the surface thereof. An optical waveguide lens 36 is formed in the slab optical waveguide 4 and may, for example, be a geodesic lens, a Luneburg lens, or a Fresnel lens. A semiconductor laser 8 is connected to an end surface of the substrate 2. Since the semiconductor laser 8 is disposed at the focal point of the optical waveguide lens 36, a divergent light beam 38 introduced into the slab optical waveguide 4 from the semiconductor laser 8 passes through the optical waveguide lens 36 and is thereby collimated to become a parallel guided light beam 40.

In addition, an integrated optical device such as described above has been used as a wavelength wave divider and as an optical spectrum analyzer. Examples of such uses will now be described.

FIG. 2 is a schematic perspective view illustrating an example of a conventional wavelength wave divider. In the Figure, a collimating optical waveguide lens 60, wave-dividing gratings 62a, 62b, converging optical waveguide lenses 64a, 64b, and photodetectors 66a, 66b are disposed in the slab optical waveguide 4 formed on the substrate 2. In addition, the wave-dividing gratings 62a, 62b have different wavelength selection characteristics. An optical fiber 68 for introducing input light is coupled to an end surface of the substrate 2. Since the coupling position is arranged so as to become the focal point of the collimating optical waveguide lens 60, a divergent light beam 70, generated when multiple wavelength optical signals from the optical fiber 68 are introduced into the slab optical waveguide 4, is collimated into a parallel guided beam 72 by passing through the optical waveguide lens 60. Subsequently, the guided beam 72 having a plurality of wavelength components is diffracted by means of the gratings 62a, 62b to generate diffracted guided beams 74a, 74b. The diffracted guided beams 74a, 74b have wavelengths which substantially satisfy the Bragg condition. In other words, assuming that the pitches of the gratings 62a, 62b are $\Lambda a$, $\Lambda b$, respectively, selected wavelengths $\lambda a$, $\lambda b$ can be given by the following formula:

$$\lambda i = 2 N i \Lambda i \sin \theta i$$

where i is a or b; $Ni$ is a standardization propagation constant (an effective refractive index); and $\theta i$ is a Bragg angle ($2\theta i$ is a deflection angle).

The light beams 74a, 74b with the selected and spatially separated wavelengths $\lambda a$, $\lambda b$ are converged, respectively by condenser lenses 64a, 64b and are made incident upon photodetectors 66a, 66b so as to be detected.

FIG. 3 is a schematic perspective view illustrating an example of the arrangement of a conventional integrated optical spectrum analyzer (IOSA).

In the Figure, a collimating optical waveguide lens 76, an optical waveguide lens 78 for Fourier transformation, a photodetector array (e.g., CCD) 80, and a comb electrode 82 for exciting surface acoustic waves are disposed in the slab optical waveguide 4 formed on the surface of the substrate 2. A semiconductor laser 84 is coupled with an end surface of the substrate 2. The semiconductor laser 84 is disposed at the focal point of the collimating optical waveguide lens 76, while the photodetector array 80 is disposed at the focal point of the optical waveguide lens 78 for Fourier transformation. A divergent light beam 86, which is introduced from the semiconductor laser 84 into the slab optical waveguide 4, is collimated into a parallel guided beam 88 by passing through the optical waveguide lens 76. A surface acoustic wave 90 is excited by applying a radio frequency (RF) signal to the comb electrode 82, and the collimated parallel beam 88 is subjected to Bragg diffraction by means of the surface acoustic wave 90. An angle of diffraction is determined in response to the wavelength of the surface acoustic wave 90, i.e., the frequency of the applied RF signal. Thus, since the image-forming position changes in response to the angle of diffraction by causing the diffracted beam 92 to form an image at the photodetector array 80 by means of the Fourier transform lens 78, the spectrum of the diffracted beam, i.e., the spectrum of the RF signal, can be obtained on a real-time basis.

However, the conventional integrated optical devices described above have suffered from the following drawbacks.

First, since an optical waveguide lens is employed on the input and output sides, respectively, there is a limit to the compactness of the device. For instance, when an input light beam from the semiconductor laser 8 is made into a parallel light beam, as shown in FIG. 1, since the angle of divergence of the divergent light beam from the semiconductor laser 8 is fixed, it becomes necessary to provide a large distance between the semiconductor laser 8 and the optical waveguide lens 36 in order to obtain a wide parallel beam (namely, it is necessary to use a lens having a large focal length). In addition, in an optical spectrum analyzer such as shown in FIG. 3, a large-aperture lens is required to effect a spectrum analysis with high resolving power, so that the device is inevitably large in size.

Second, in order to improve the accuracy of the degree of parallelism, etc., of the collimated light beam, it is necessary to place the focal point of the optical waveguide lens at a desired photocoupling position, which requires high-level alignment techniques, with the result that fabrication is difficult and the yield is low.

Third, although various types of waveguide lenses have been proposed, none of them has a large degree of freedom in design in terms of focal length, aperture, and the like, with the result that restrictions are imposed on the specifications of the device.

Furthermore, in the case of the spectrum analyzer shown in FIG. 3, there also has been a problem in that, in order to obtain high resolving power, it is necessary to reduce the spatial resolution, i.e., the bit size, of the photodetector array 80, thereby making fabrication difficult.

A technique for obtaining a wide parallel light beam in a compact arrangement by monolithically forming a semiconductor laser and a grating coupler on an optical waveguide has been proposed in H. M. Stoll "High-Brightness Lasers Using Integrated Optics," SPIE 139, pp. 113-116 (1978). In the grating coupler described in that paper, however, a grating structure is formed on a slab optical waveguide. Such an arrangement has a drawback in that, since the light beam from the semiconductor laser is a divergent light beam, the diffraction efficiency is reduced, and it is therefore difficult to input a beam at a sufficient level of efficiency.

SUMMARY OF THE INVENTION

Accordingly, an object of the present invention is to provide an integrated optical device which is both compact and capable of inputting and outputting a beam of light with a high level of efficiency.

The aforementioned object of the present invention is attained by providing, in accordance with one aspect of the invention, an integrated optical device comprising a substrate, a slab optical waveguide provided on the substrate, a channel optical waveguide provided at a portion of the slab optical waveguide, and a grating coupler provided with a grating structure at a portion of the channel optical waveguide and adapted to optically couple the slab optical waveguide and the channel optical waveguide.

In accordance with another aspect of the invention, there is provided an integrated optical device comprising a substrate, a slab optical waveguide provided on the substrate, an input-side channel optical waveguide provided at a portion of the slab optical waveguide, an input-side grating coupler having a grating structure provided at at least one portion of the input-side channel optical waveguide to optically couple the input-side channel optical waveguide and the slab optical waveguide, an output-side channel optical waveguide provided at another portion of the slab optical waveguide, an output-side grating coupler having a grating structure provided at at least one portion of the output-side channel optical waveguide to optically couple the slab optical waveguide and the output-side channel optical waveguide, and a photodetector for detecting light propagating through the output-side channel optical waveguide.

In accordance with still another aspect of the invention, there is provided an integrated optical device comprising a substrate, a slab optical waveguide provided on the substrate, an input-side channel optical waveguide provided at a portion of the slab optical waveguide, a light source for supplying a beam of light to the input-side channel optical waveguide, an input-side grating coupler having a grating structure provided at at least one portion of the input-side channel optical waveguide to input a beam of light propagated through the input-side channel optical waveguide into the slab optical waveguide, an output-side channel optical waveguide provided at another portion of the slab optical waveguide, an output-side grating coupler having a grating structure provided at at least one portion of the output-side channel optical waveguide to output a beam of light, input from the input-side channel optical waveguide and propagated through the slab optical waveguide, to the output-side channel optical waveguide, and a photodetector for detecting a beam of light propagating through the output-side channel optical waveguide.

DESCRIPTION OF THE PREFERRED EMBODIMENTS

Figure 1:
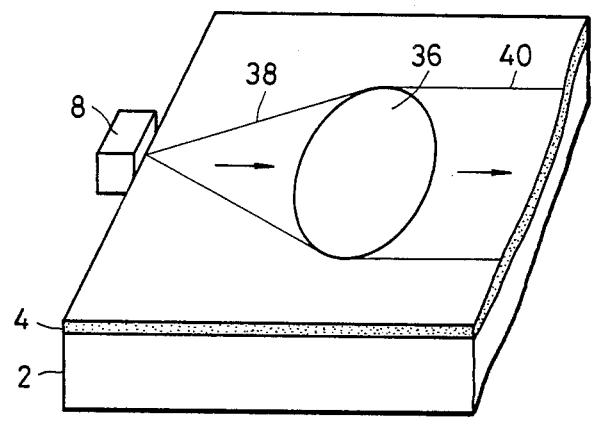
FIG. 1 is a schematic perspective view of an input portion of a conventional integrated optical device.
Figure 2:
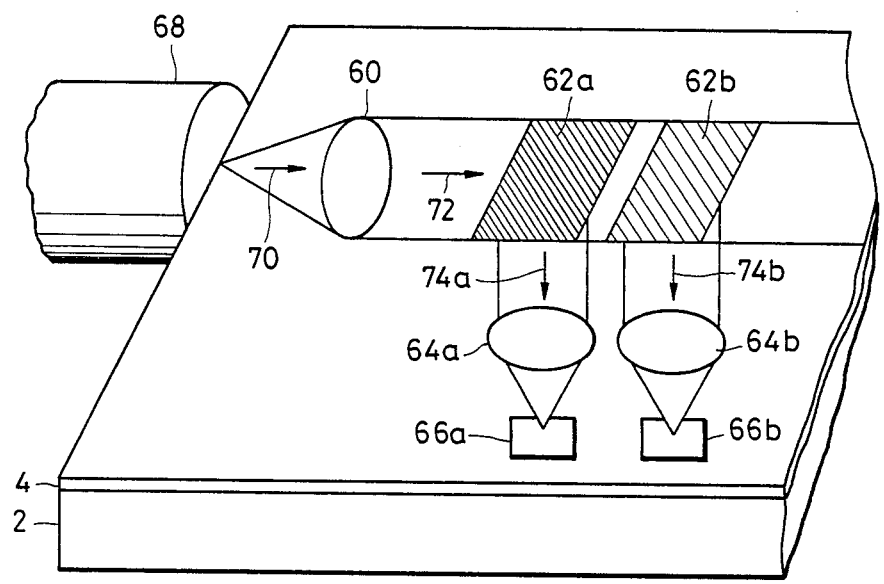
FIG. 2 is a schematic perspective view of a conventional wavelength dvider.

Referring now to the drawings, several embodiments of the present invention will be described in detail below.

Figure 4:
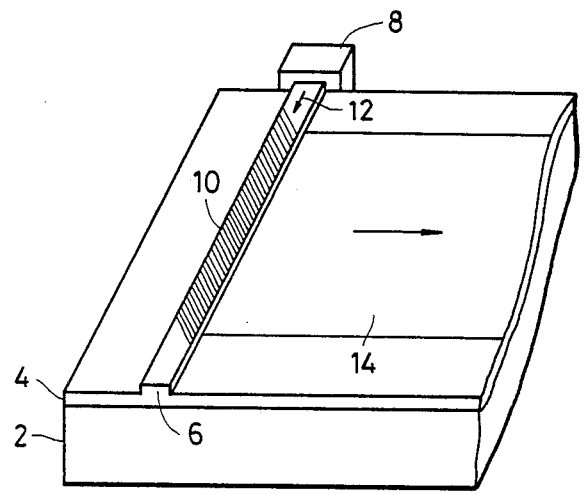
FIG. 4 is a schematic perspective view of an input portion of an integrated optical device in accordance with one embodiment of the present invention.

FIG. 4 is a partial perspective view of a light input portion of one embodiment of an integrated optical device in accordance with the present invention. In the Figure, reference numeral 2 denotes a substrate, while reference numeral 4 denotes a slab optical waveguide formed on the surface of the substrate 2. A channel optical waveguide 6 is formed on a portion of this slab optical waveguide structure and extends to an end surface of the substrate 2, and a semiconductor laser 8, i.e., a light source, is coupled to one end thereof. A grating structure 10 is formed in a portion of the channel optical waveguide 6. The channel optical waveguide 6 is also called a three-dimensional optical waveguide, and has the function of confining the light in a direction perpendicular to the surface of the substrate 2 and within a plane parallel to the substrate 2. In this embodiment, this channel optical waveguide 6 is formed by providing a striped protrusion (a rib structure) on a portion of the surface of the slab optical waveguide 4.

A light beam 12 from the semiconductor laser 8 can propagate without being diffused in the channel optical waveguide 6. Its propagation constant is determined by the guided mode of the propagation through the channel optical waveguide 6.

Figure 5:
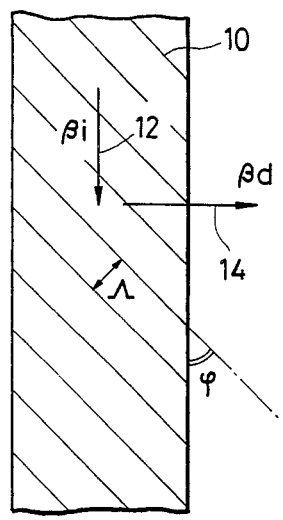
FIG. 5 is an enlarged top plan view of the grating structure shown in FIG. 4.
Figure 6:
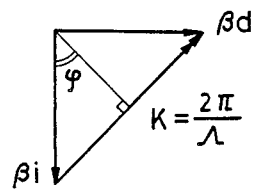
FIG. 6 is a vector chart illustrating the Bragg condition in the grating structure shown in FIG. 5.

FIG. 5 is an enlarged top plan view of a grating coupler having the above arrangement. The guided light beam 12 which is propagated through the channel optical waveguide 6 is subjected to Bragg diffraction by means of the grating structure 10 formed in a portion of the channel waveguide, and is thus converted into a guided light beam 14 which propagates through the slab waveguide 4. In order for Bragg diffraction to take place, it is necessary to substantially satisfy the following Bragg condition:

$$\beta i^2 + K^2 - 2\beta i K \cos\left(\frac{\pi}{2} - \phi\right) = \beta d^2 \quad (1)$$

where $\beta i$ and $\beta d$ are the propagation constants of the incident guided light beam 12 and the diffracted guided light beam 14, respectively, while K is a grating constant given by $K = 2\pi/\Lambda$, with the pitch of the grating being $\Lambda$. In addition, $\phi$ is the angle formed between the direction of an equiphase plane and the direction of the channel waveguide 6 (see FIG. 5). FIG. 6 is a vector chart illustrating the Bragg condition.

For instance, if the channel waveguide 6 is assumed to consist of a rib structure formed on the slab waveguide 4 using Corning #7059 glass, the propagation constant is $\beta i/k(\sim d/k) = N \sim 1.5$; $k = 2\pi/\lambda$, where $\lambda$ is the wavelength of light in a vacuum. If the propagation constants of the slab-guided light beam 14 and the channel-guided light beam 12 are assumed to have no substantial difference, and so are approximated, Formula (1) can be rewritten as follows:

$$2\beta \sin\phi = K \quad (2)$$

$$\therefore \Lambda = \frac{\lambda}{2N \sin\phi} \quad (3)$$

For instance, if the wavelength of light is $\lambda = 0.78$ μm and the deflection angle is $2\phi = 90°$, the grating pitch should preferably be set to $\Lambda = 0.368$ μm.

The light waves thus subjected to Bragg diffraction are output as the light beam 14 guided through the slab waveguide 4 which has the function of confining the light solely in a unidimensional direction, so that it becomes possible to obtain a beam width corresponding to the length of the grating structure 10 along the longitudinal direction of the channel waveguide 6.

It should be noted that the Bragg diffraction employed in the present embodiment necessitates the condition that the incident light beam is a guided light beam propagating through a channel waveguide, and that the diffracted light beam is a guided light beam propagating through a slab waveguide (strictly speaking, it is a slab-mode guided light beam which is confined solely in a direction perpendicular to the surface of the substrate in the channel waveguide).

In the present embodiment, since beam coupling is performed in the channel waveguide, it is possible to prevent the diffusion of the incident light beam, and the beam width conversion can be effected efficiently.

The degree of coupling between the diffracted waves and the incident waves can be adjusted by means of the coupling coefficient of the grating. The coupling coefficient of the grating is a value which is determined by parameters such as the degree of variation of the refractive index in the grating portion and the degree of variation in the relief depth.

Figure 7:
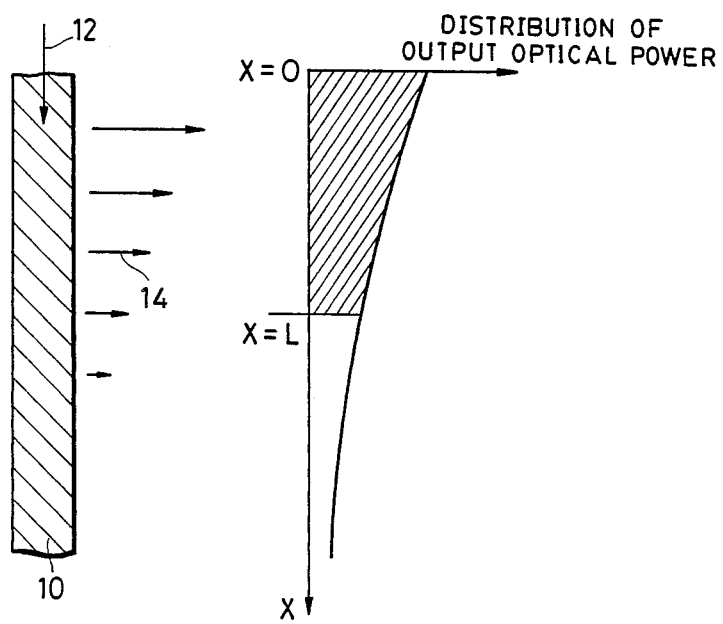
FIG. 7 schematically illustrates the distribution of output power from a channel optical waveguide to a slab optical waveguide.

In order for the output guided light beam 14 to be output efficiently, an appropriate coefficient of grating coupling must be realized with respect to the desired beam width. If the grating structure has a uniform coefficient of grating coupling, the spatial distribution of the power of the output guided light beam 14 is expressed by a function which decreases linearly from the coupling end. By applying wave coupling theory, the efficiency $\eta$ (L) of the optical power output from the coupling end as far as the length L, with respect to the input optical power, is expressed by:

$$\eta(L) = \tan h^2(\kappa L) \quad (4)$$

where $\kappa$ is the grating coupling coefficient. FIG. 7 schematically illustrates the distribution of the output optical power. The partial optical power up to the length L, described above, is the integral of the power density in the hatched portion.

Figure 8:
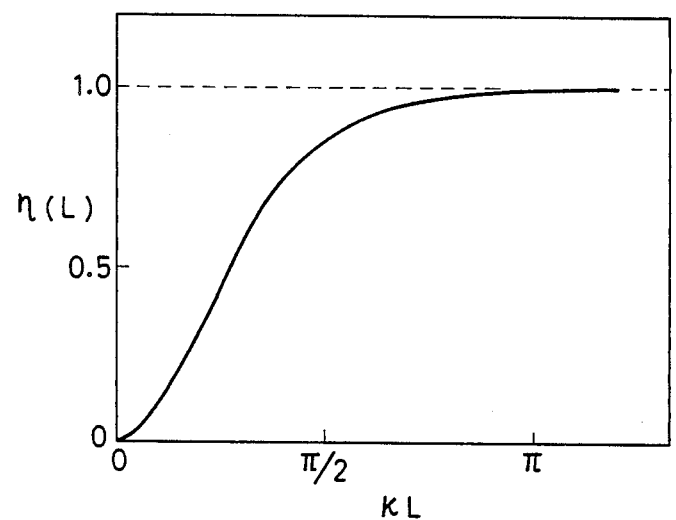
FIG. 8 illustrates the relationship between coupling length and efficiency of a grating coupler.

FIG. 8 shows the relationship between the coupling length L and the coupling efficiency $\eta$ (L).

Formula (4) indicates that the coupling efficiency approachs 100% as L increases. It is possible to obtain nearly 100% efficiency when $L = \pi$ or more. Accordingly, the desired output beam width W should preferably be set within the range expressed by the following inequality, taking into account the overall efficiency and the uniformity of distribution:

$$\frac{\pi}{2} \lesssim \kappa W \lesssim \pi \quad (5)$$

In other words, if the coupling is weak and $\kappa W < \pi/2$, the overall efficiency $\eta(W)$ drops; whereas, if the coupling is strong and $\kappa W > \pi$, the distribution of output light becomes nonuniform. Hence, it cannot be said that the output light is desirable as an output beam in either case.

As described above, if the grating coupling coefficient is uniform, the spatial distribution of the output light becomes nonuniform in principle. Therefore, when it is necessary to obtain a particularly uniform beam for a specific application, suitable weighting may be carried out, as required, on the distribution of refractive index or on the distribution of the relief depth when the grating structure is formed. Specifically, in FIG. 7, for instance, the grating structure 10 may be formed in such a manner that the coupling efficiency is lower in the portion where X is small, while the coupling efficiency is higher in the portion where X is large, along the direction of propagation of the channel waveguide 12.

Figure 9:
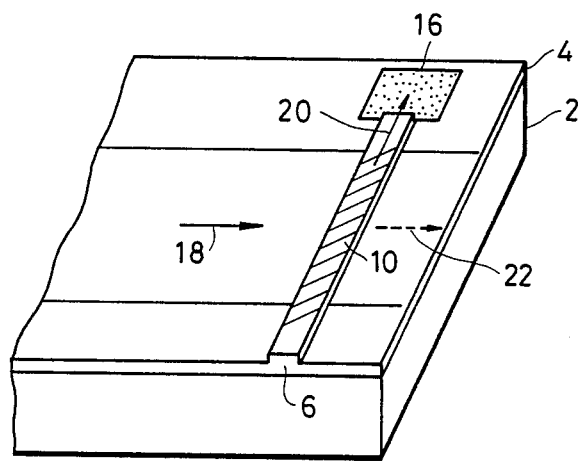
FIG. 9 is a schematic perspective view of an output portion of an integrated, optical device in accordance with another embodiment of the present invention.

FIG. 9 is a partial perspective view of the light output portion of another embodiment of an integrated optical device of the present invention. In this embodiment, the input light beam from the slab waveguide 4 is output to the channel waveguide 6, contrary to the embodiment shown in FIG. 4.

In FIG. 9, reference numeral 16 denotes a photodetector formed in a portion of the slab optical waveguide 4, and one end of the channel optical waveguide 6 is coupled to the photodetector 16.

A guided light beam 18 which is made incident from the slab waveguide 4 is subjected to Bragg diffraction by the grating 10 formed in the channel waveguide 6, and is thus converted into a guided light beam 20 propagating through the channel waveguide 6. The guided light beam 20 can be detected efficiently by a photodetector 16.

Although, in the embodiment shown in FIG. 4, a sufficiently large coupling length makes it possible to make the overall efficiency close to 100%, in this embodiment, it is possible to make the light beam coupled to the channel waveguide 6 recouple with a slab-guided light beam 22. Accordingly, high efficiency should preferably be attained by optimizing the grating coupling coefficient $\kappa$ with respect to the input of a desired beam width W. To this end, an optimum design can be achieved by using a technique similar to the one whereby the grating coefficient is distributed to maximize the input coupling efficiency in the grating coupler. As for the efficiency of a grating coupler, a detailed description is given, for instance, in R. Ulrich "Efficiency of Optical-Grating Couplers," J. Opt. Soc. Am. 63, 11, pp. 1419-1431.

This embodiment has the advantage that the optical power can be converged into the very small photodetector 16 by converting the wide slab-guided light beam 18 into a channel-guided light beam 20, so that the response speed can be improved by making the photodetector compact.

In addition, adjustment of the grating coupling coefficient permits the realization of a tapping function for coupling part of the optical power of the slab-guided light beam 18.

Figure 10:
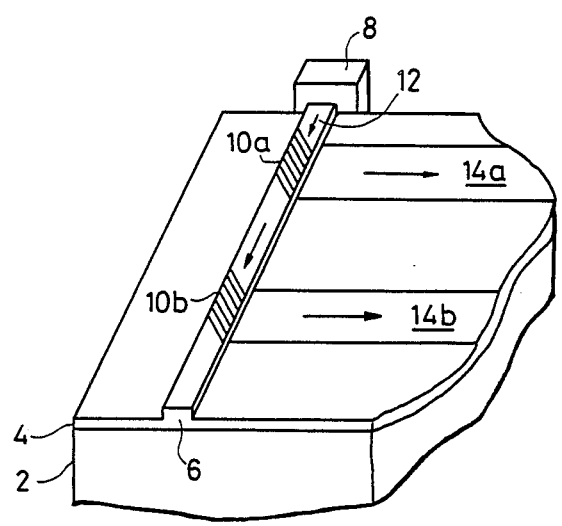
FIGS. 10, 12, 13 and 14 are schematic perspective views of modified input portions of an integrated optical device in accordance with the present invention.

FIG. 10 is a schematic perspective view of a modified light input portion of an integrated optical device in accordance with the present invention. This modification differs from the embodiment shown in FIG. 4 only in that a plurality of grating coupling portions 10a, 10b (two coupling portions in the illustrated case) are formed on one channel waveguide 6, thereby making it possible to obtain a plurality of output beams 14a, 14b (two output beams in the illustrated case).

Figure 11:
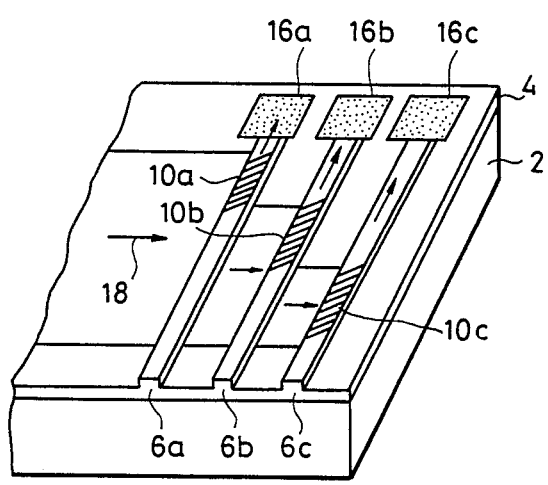
FIG. 11 is a schematic perspective view of a modified output portion of an integrated optical device in accordance with the present invention.

FIG. 11 is a schematic perspective view of a modified output portion of the integrated optical device in accordance with the present invention. This modification differs from the embodiment shown in FIG. 9 by having a plurality of channel waveguides 6a-6c (three channel waveguides in the illustrated case) disposed in parallel. Grating coupling portions 10a-10c formed thereon are disposed in such a manner as to be offset from each other in the transverse direction of the incident beam 18, with the result that the spatial distribution of the incident slab-guided beam 18 can be detected by independent photodetectors 16a-16c which are each coupled to one end of the corresponding channel guide-waves 6a-6c.

Figure 12:
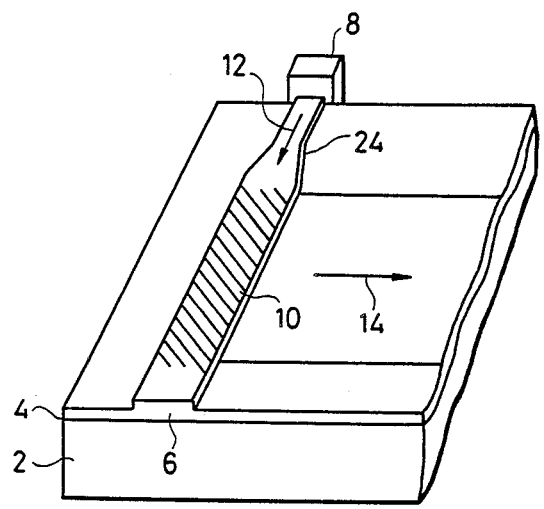

FIG. 12 is a schematic perspective view of another modified light input portion in accordance with the present invention. This modification differs from the embodiment shown in FIG. 4 in that the channel width of the channel waveguide 6 differs between the input portion close to an entrance end surface of the substrate 2 and the grating coupling portion. A horn-shaped transitional region 24 where the channel width varies gradually is provided in the intermediate portion between these two portions of the channel waveguide 6.

As already described in relation to the embodiment shown in FIG. 4, in the grating coupling portion, only light waves that substantially satisfy the Bragg condition are involved in coupling. If the incident beam maintains a multimode, i.e., if the incident beam has dispersant spectra having different propagation constants, only the modes that substantially satisfy the Bragg condition are involved in coupling in the grating, and light waves of other modes are transmitted. Accordingly, the requirement for realizing the transmission of maximum power is that, in the portion where the grating structure 10 is provided, the incident beam must have a single propagation constant, i.e., a single mode. This requirement does not necessarily mean that the portion where the grating structure 10 is provided must be a single-mode channel waveguide; it suffices if the incident beam is excited selectively in the single mode.

Generally speaking, in order to provide a channel waveguide with a single mode, in the case of the rib-type structure shown in FIG. 12, it is necessary to set its width at several microns or thereabout. However, if the channel width becomes several times greater than the wavelength being used, variations in the magnitude and direction of the vectors of the grating constant K occur in the grating formed thereon, so that the selectivity of the incident beam becomes wide. In addition, variations also take place in the propagation constant of the diffracted beam, i.e., the output beam, with the result that the accuracy of collimation deteriorates. Accordingly, in the portion where the grating structure 10 is provided, coupling of light waves should preferably be carried out in the Bragg region with a view to optimizing the characteristics.

In order to satisfy the aforementioned requirements, i.e., (1) the single-mode propagation in the grating coupling region and (2) photocoupling in the region of the Bragg condition, it becomes necessary to effect the single-mode propagation in a relatively wide channel waveguide.

Furthermore, it is preferable in the end-surface portion for coupling with the semiconductor laser 8 to provide for the input coupling to be effected at a high level of efficiency by ensuring that the field distribution in the beam-emitting region of the laser is made to agree with the field distribution in the channel waveguide 6. Generally, however, the channel waveguide width at the end-surface coupling portion on the input side and the channel waveguide width at the grating coupling portion have different optimum values.

In this modification, therefore, the horn-shaped transitional region 24 shown in FIG. 12 is formed. In particular, if the channel waveguide 10 is of the single mode in the end-surface coupling portion on the input side and of the multimode at the grating-coupling portion, it is desirable to vary the channel width sufficiently gently in the horn-shaped transitional region 24 so as to ensure single-mode propagation at the grating coupling portion.

If the grating coupling portion and the input-side surface-end coupling portion are optimized by carrying out the aforementioned design, it is possible in this modification to optimize the characteristics of both the end-surface input coupling and the grating coupling.

Figure 13:
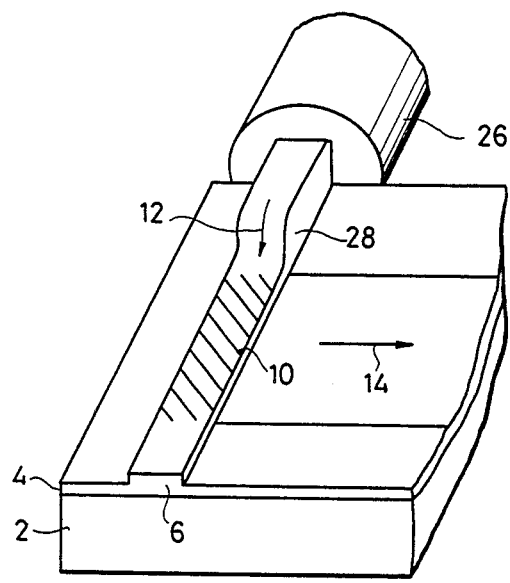

FIG. 13 shows a schematic perspective view of another modified light input portion in accordance with the present invention. In this modification, an optical fiber 26 is used as the source of input light. In order to make the field distribution at the core of the optical fiber 26 agree with the field distribution in the channel waveguide 6, the thickness of the channel waveguide 6 is made large. Reference numeral 28 denotes a transitional region where the thickness of the channel waveguide varies.

Figure 14:
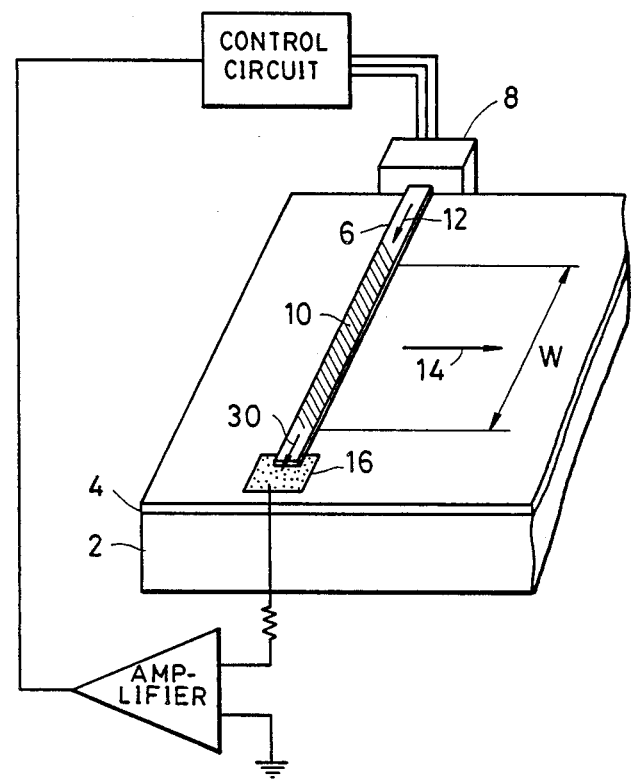
Figure 15A:
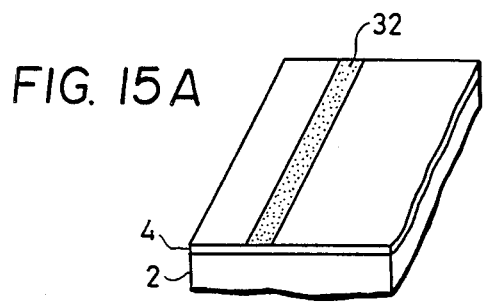
FIGS. 15A–15D are schematic perspective views of a method of fabricating an integrated optical device in accordance with the present invention.
Figure 15B:
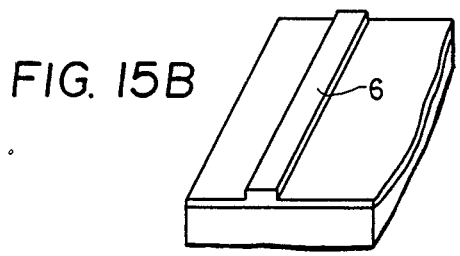
Figure 15C:
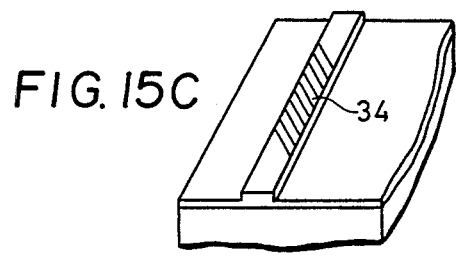
Figure 15D:
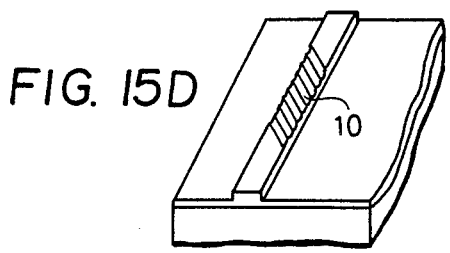

FIG. 14 is a schematic perspective view of an arrangement of the present invention provided with a means for controlling the input light.

In the grating coupler in the present invention, substantially satisfying the Bragg condition leads to obtaining a highly efficient device. In fabrication of the device, however, it is conceivable that the propagation constant may vary and the grating pitch A and the angle of inclination $\phi$ may contain errors due to a dimensional error in the channel waveguide 6. In addition, the wavelength shift of the semiconductor laser 8, which is the input light source, also presents a major problem.

In this modification, therefore, a photodetector 16 is coupled at one end of the channel waveguide 6, and a feedback control circuit is provided for controlling the semiconductor laser 8 in response to the output of the detector. In other words, if the Bragg codition is not satisfied, the amount of light 30 transmitted through the grating coupling portion 10 increases, so that the degree of coupling can be monitored by detecting the same with the photodetector 16, and the semiconductor laser 8 can thereby be controlled. The oscillation wavelength of the semiconductor laser 8 can be controlled by adjusting the temperature, input current, etc.

In this embodiment, by monitoring the degree of deviation in the Bragg condition through the transmitted light 30, as described above, it is possible not only to maximize the coupling degree but also to control the intensity, the distribution width, etc. of the output beam 14 by imparting a desired coupling degree thereto.

In this modification, a method of varying the wavelength of the light source has been described as a method of satisfying the phase matching of the Bragg condition, though various other types of phase matching methods utilized in optical directional couplers, etc., may be employed to vary the propagation constant. Also a method of applying a thin film capable of varying the refractive index onto the waveguide may be used.

Next, a brief description will be made of an example of a fabrication method for forming an integrated optical device in accordance with the present invention. A fabrication method is shown in FIGS. 15A-15D.

First, Corning #7059 glass is deposited on a quartz substrate 2 by sputtering to form the slab waveguide 4. Then, a stripe pattern 32 of photoresist is formed using the technique of photolithography to form an etching mask (see FIG. 15A). Etching can be effected by a dry process using ion beams or the like. As a result the channel waveguide 6 is fabricated so that a desired propagation constant is obtained by controlling its width and height (see FIG. 15B). Furthermore, a grating pattern is formed by electron beam exposure to form a photoresist mask 34 (see FIG. 15C). Then, dry etching is performed again to form the relief-like grating coupling portion 10 on the channel waveguide 6.

Furthermore, the end surface of the channel waveguide is polished for the purpose of coupling with the semiconductor laser. In order to arrange a photodetector such as the one shown in FIG. 9, it is advantageous to employ as the substrate 2 a Si substrate having a $SiO_2$ layer as a buffer layer. It goes without saying that, if a substrate of GaAs, InP, and the like is employed, a monolithic device in which the light source and the photodetector are integrated can be realized.

Next, specific examples of the application of an integrated optical device in accordance with the present invention will be described.

Figure 16:
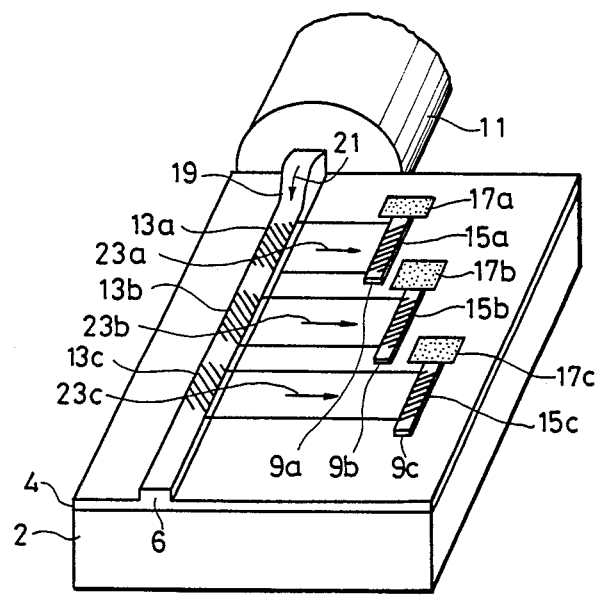
FIG. 16 is a schematic perspective view illustrating an example of the present invention applied to a wavelength wave divider.

FIG. 16 is a schematic perspective view of an example of the present invention applied to a wavelength wave divider. In the Figure, reference numeral 2 denotes the substrate, while reference numeral 4 denotes the slab optical waveguide formed on the surface of the substrate. The input-side channel optical waveguide 6 and output-side channel optical waveguides 9a, 9b, and 9c are each formed on different parts of this slab optical waveguide structure. The input-side channel optical waveguide 6 extends from one end surface of the substrate 2 to the other, and an optical fiber 11 is coupled to one end thereof as an input light source. Three gratings 13a, 13b, and 13c are formed on the channel optical waveguide 6. These gratings are formed at positions corresponding to the output-side channel optical waveguides 9a, 9b, and 9c, respectively. Gratings 15a, 15b, and 15c are formed on the output-side channel optical waveguides 9a, 9b, and 9c, respectively. In addition, the photodetectors 17a, 17b, and 17c formed in the slab waveguide 4 are each coupled to one end of the output-side channel optical waveguides 9a, 9b, and 9c, respectively. In this embodiment, the thickness of that portion of the input-side channel optical waveguide 6 adjacent to the portion thereof for coupling with the optical fiber 11 is greater than the thickness of the portions where the gratings 13a, 13b, and 13c are formed, and reference numeral 19 denotes a thickness-varying transitional region lying between them.

In this embodiment, the gratings 13a-13c on the input-side channel waveguide 6 have different pitches and/or angles of inclination, respectively, and hence only the light of specific wavelengths within an input channel-guided light beam 21 introduced from the optical fiber 11 is subjected to Bragg diffraction, thereby converting the same into slab-guided light beams 23a, 23b, and 23c, respectively. In other words, the gratings 13a-13c are fabricated in such a manner that they substantially satisfy the Bragg condition corresponding to the respective selected wavelengths $\lambda i$:

$$\lambda i = 2 N i \Lambda i \sin \theta i \tag{6}$$

where i is a, b, or c; Ni is the equivalent refractive index of the guided light beam: Λi is a grating pitch; and θi is an angle of refraction. Optical waves thus subjected to Bragg diffraction are output as light beams guided through the slab waveguide 4 which has the confining function solely in a single direction. Consequently, it becomes possible to obtain beam widths corresponding to the lengths of the respective grating structures 13a, 13b, and 13c in the longitudinal direction of the channel waveguide 6. It should be noted that the Bragg diffraction here necessitates the fullfilment of the condition that the light beam is a guided light beam propagating through a channel waveguide, and that the diffracted light beams are guided light beams propagating through a slab waveguide (strictly speaking, they are slab-mode guided light beams which are confined in a single direction perpendicular to the surface of the substrate in the channel waveguide).

In this way, in the grating coupling portion of the input-side channel waveguide 6, only those light waves that substantially satisfy the Bragg condition are involved in coupling. If the incident beam maintains the multimode, i.e., if the incident beam has dispersant spectra having different propagation constants, only the modes that substantially satisfy the Bragg condition are involved in coupling in the grating, and light waves of other modes are transmitted therethrough. Accordingly, the requirement for realizing the transmission of maximum power is that, in the grating coupling portion, the incident beam must have a single propagation constant, i.e., a single mode. This requirement does not necessarily mean that the grating coupling portion must be a single-mode channel waveguide; it suffices if the incident beam is excited selectively in the single mode.

Thus the light waves 21 input from the optical fiber 11 into the channel waveguide 6 are made incident upon the grating coupling portions 13a–13c while maintaining the single mode, i.e., maintaining a single propagation constant and polarized state. For this purpose, the thickness and width of the waveguide in a transitional region 19 located between the optical fiber coupling portion and the grating coupling portion are made to vary at a suitably gradual gradient.

Slab-guided optical beams 23a, 23b, and 23c are subjected to Bragg diffraction in the output-side channel waveguides 9a, 9b, and 9c by means of the gratings 15a, 15b, and 15c, respectively, and are converted into channel-guided light beams. These channel-guided light beams in a converged state are made incident upon the photodetectors 17a, 17b, and 17c and are thereby detected, respectively. Thus it is possible to efficiently separate the optical signals of each wavelength.

In order to obtain a high level of efficiency, it is necessary that the Bragg condition be satisfied and the phase matching be obtained in the grating coupling portions, and that the matching of the distribution of intensity be attained in the grating coupling portions 15a–15c of the output-side channel waveguides. With respect to these conditions, reference can be made to the aforementioned paper by R. Ulrich.

Figure 17:
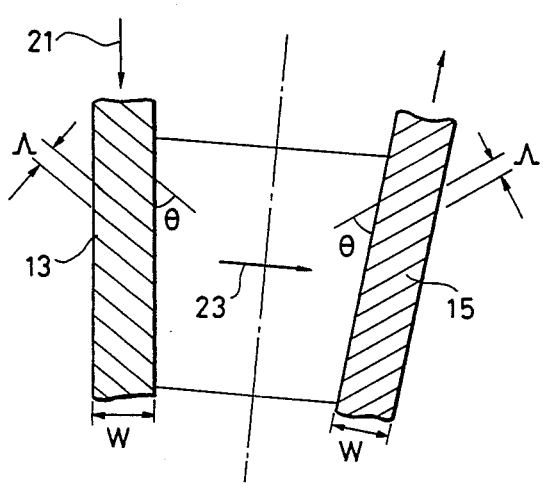
FIG. 17 is an enlarged top plan view of the grating portion of the device shown in FIG. 16.

To match the distribution of intensity in the output-side grating coupling portions, an arrangement is made such that the input and output gratings 13, 15 are symmetrical with each other about each of the slab-guided light beams 23, as shown in FIG. 17, and that the grating coupling coefficients are distributed uniformly. Since this symmetrical structure makes it possible to attain efficiency similar to that obtained by reflecting the guided light beams 23 toward the gratings 13 and bending the same, it is possible to effect input and output coupling at a high level of efficiency.

With respect to the coupling efficiency η of output, the wave coupling theory can be applied if the channel waveguide width W is sufficiently large relative to the wavelength and the grating pitch, and the following coupling efficiency η can be otained:

$$\eta = \tanh^2(\kappa L) \tag{7}$$

where κ is a coupling coefficient in a grating portion, and L is the length of a coupling portion.

Meanwhile, the wavelength selectivity is disproportional to the coupling coefficient λ, and is a function of the channel waveguide width W, wavelength κ, and pitch Λ.

In the aforementioned embodiment, although, as a coupling grating portion in the input-side channel waveguide, an arrangement is used in which the gratings 13a–13c of a uniform pitch are connected in multiple steps, it is possible to employ a chirped grating in which the pitch is spatially varied, instead of the arrangement just mentioned.

Figure 18:
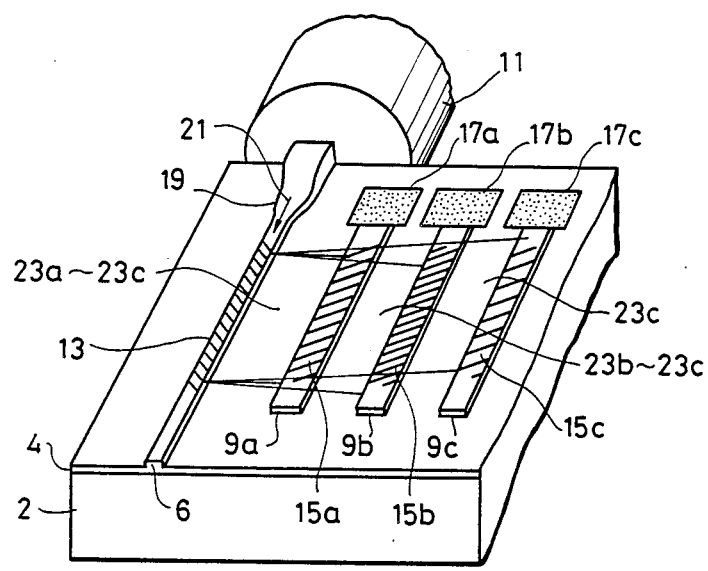
FIG. 18 is a schematic perspective view illustrating an example of the present invention applied to a wavelength wave divider.

FIG. 18 is a schematic perspective view of another embodiment of the present invention applied to a wavelength wave divider.

In this embodiment, a grating with wide wavelength selectivity is employed as the grating 13 formed on the input-side channel waveguide 6, while gratings 15a–15c with narrow wavelength selectivity are employed as the gratings 15a–15c formed on the output-side channel waveguides 9a–9c. In the input-side grating coupling portion, since the channel waveguide width is narrow, the scope of wavelength selection is wide, so that a plurality of wavelengths in the vicinity of the Bragg condition can be subjected to diffraction. Each of the emergent slab-guided light beams 23a–23c is a light wave having a different wavelength, and has a different angle of emergence. Since the channel width is made wide and the wavelength selectivity is made sharp in the output-side grating coupling portions 15a–15c, only light waves of specific incident conditions (i.e., wavelength and angle of incidence) are selectively coupled, and the respective wavelength components are separated and detected by the photodetectors 17a–17c.

Figure 19:
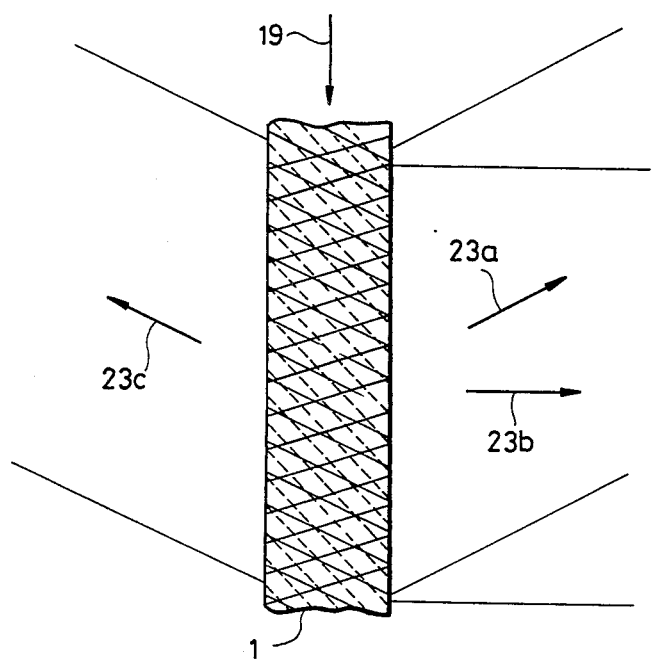
FIG. 19 is an enlarged top plan view of a modified grating coupler in accordance with the present invention.

In the aforementioned embodiment, although, in the input-side grating coupling portion, a uniform grating 13 with a wide scope of wavelength selection is employed, light waves having a plurality of wavelengths may be coupled by forming a plurality of superimposed multiple gratings, as shown in FIG. 19.

It should be noted that, in the present embodiment, both the channel width and the channel thickness are varied continuously in the transitional region 19.

Figure 20:
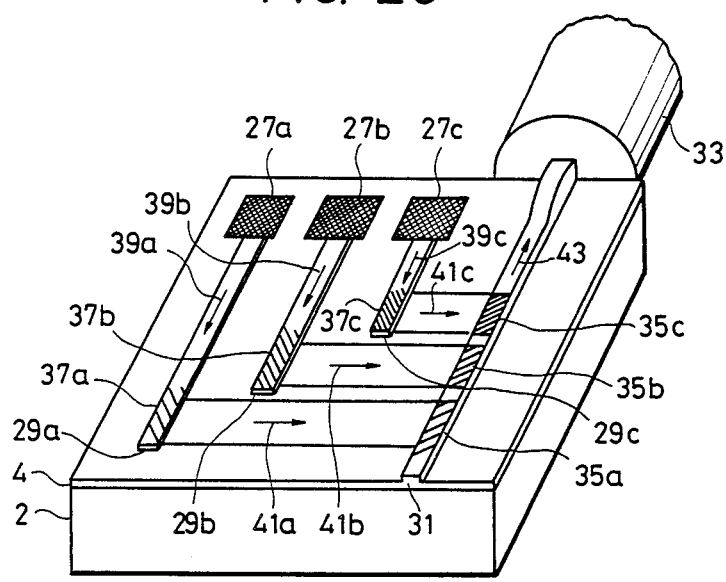
FIG. 20 is a schematic perspective view illustrating an example of the present invention applied to a wavelength synthesizer.

FIG. 20 is a schematic perspective view of an example of the present invention as applied to a beam synthesizer. In the Figure, reference numerals 27a–27c denote distributed feed back (DFB) lasers with varying oscillation wavelengths which are formed in a portion of the slab waveguide 4. Reference numerals 29a–29c are input-side channel waveguides formed on a portion of the slab waveguide 4, one end of each being coupled with the DFB lasers 27a–27c. Reference numeral 31 denotes an output-side channel waveguide formed at another part of the slab waveguide 4, the waveguide extending from one end surface of the substrate 2 to the other, one end being coupled with an optical fiber 33. Three types of gratings 35a-35c are formed on an output-side channel waveguide 31. Gratings 37a -37c are formed on the portions of the input-side waveguides 29a-29c corresponding to gratings 35a-35c.

Channel-guided light beams 39a-39c are input from the respective lasers 27a-27c into the input-side channel waveguides 29a-29c, respectively, and are then subjected to diffraction by the gratings 37a-37c, respectively, so as to be converted into slab-guided light beams 41a-41c. The slab-guided light beams are coupled by the gratings 35a-35c of the output-side channel waveguide 31 and are synthesized to become a channel-guided light beam 43. The channel-guided light beam is coupled with the optical fiber at the end surface thereof, and the light beam with multiple wavelengths thus formed is output to the optical fiber 33.

The arrangement of this embodiment is basically equivalent to the embodiment shown in FIG. 16 and differs from the same only in that the direction of propagation of the light waves is reversed.

Figure 21:
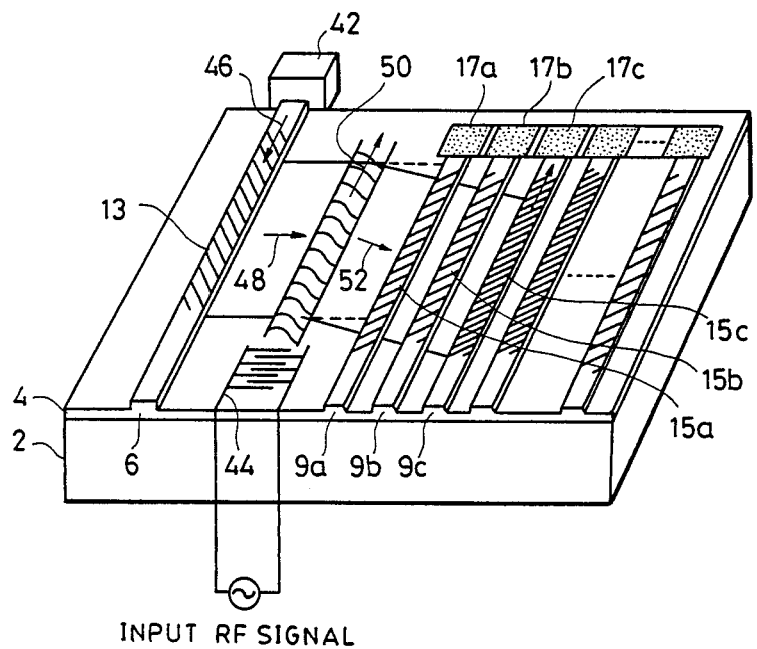
FIG. 21 is a schematic view illustrating an example of the present invention applied to an integrated optical spectrum analyzer.

FIG. 21 is a schematic view of an example of the present invention applied to an integrated radio frequency (RF) spectrum analyzer.

In the Figure, reference numeral 42 denotes a semiconductor laser which is a light source coupled to one end of an input-side channel waveguide 6. A comb electrode 44 for exciting surface acoustic waves is formed in the slab waveguide 4.

Figure 3:
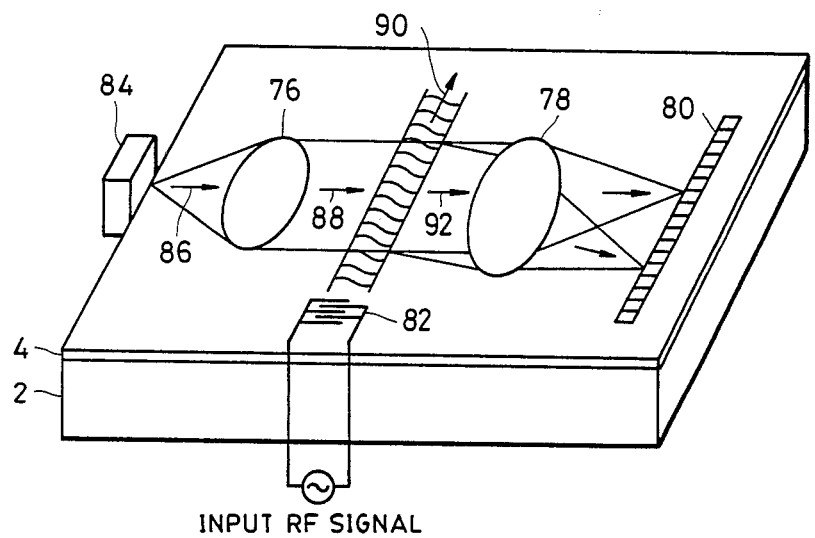
FIG. 3 is a schematic perspective view of a conventional integrated optical spectrum analyzer.

Light waves emerging from the semiconductor laser 42 are introduced into the input-side channel waveguide 6 by end-surface coupling. An excited channel-guided light beam 46 is converted into a collimated slab-guided light beam 48 by the grating 13. This collimating grating has a function similar to that of the prior-art collimator lens (the lens 76 in FIG. 3).

The collimated light beam 48 undergoes interaction with a surface acoustic wave 50 excited by the comb electrode 44 and is thereby subjected to Bragg diffraction. Since the frequency of an applied RF signal is proportional to the wavelength of the surface acoustic wave, the light waves 52 subjected to Bragg diffraction have a diffraction angle (a deflection angle) which is proportional to the RF signal.

The gratings 15a, 15b, 15c, . . . formed on the output-side channel waveguides 9a, 9b, 9c, . . . have different pitches and/or angles of inclination, and as a result a spectrum selection corresponding to their respective diffraction angles is carried out. In other words, the light waves 52 subjected to Bragg diffraction by the surface acoustic wave 50 have a predetermined diffraction angle, and, in the output-side channel waveguides, coupling occurs only in the grating coupling portions where the light beam diffracted at that diffraction angle undergoes Bragg diffraction. The components at the predetermined RF signal frequencies are detected by the predetermined photodetectors. These portions perform a function similar to the prior-art Fourier transformation portion (the Fourier transformation lens 78 in FIG. 3).

This embodiment has the characteristic feature that the selected range of spectra is determined by the selected range of angles of the grating coupling portions 15a, 15b, 15c, . . . , so that a functional operation, such as the selection and broadening of the spectra being noted, can be carried out by adjusting and rearranging the range of selection.

Figure 22:
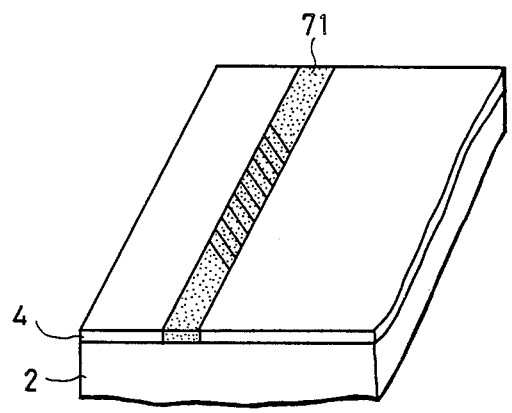
FIGS. 22 and 23 are schematic perspective views of other examples of channel waveguide constructions in accordance with the present invention.
Figure 23:
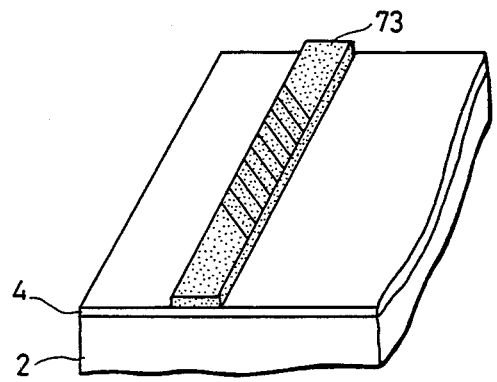

While the invention has been described above in its preferred embodiments, it is to be understood that various other modifications are possible and within the scope of the invention. For instance, as a channel optical waveguide, it is possible to employ, instead of the above-described rib type waveguide, an embedded type waveguide in which a layer 71 having a higher refractive index than the slab waveguide 4 is embedded in the slab waveguide, as shown in FIG. 22, or an applied type in which a striped film 73 is applied to the slab waveguide 4. In addition, as a method of fabricating a grating constituting a grating coupler, instead of employing photolithographic etching as described above, the grating may be fabricated by cyclically varying the refractive index of a channel waveguide in the direction in which light is propagated, or by providing a film which has a grating pattern applied on the channel waveguide.

What is claimed is:

1. An integrated optical device comprising:
a substrate;
a slab optical waveguide provided on said substrate;
a channel optical waveguide having a thickness and extending in a longitudinal direction, said channel optical waveguide provided at a portion of said slab optical waveguide; and
a grating coupler having a grating structure at a portion of said channel optical waveguide, wherein said grating coupler introduces light propagated through one of said slab optical waveguide and said channel optical waveguide into the other of said slab optical waveguide and said channel optical waveguide.

2. An integrated optical device according to claim 1, wherein said channel optical waveguide is a striped protrusion provided on said slab optical waveguide.

3. An integrated optical device according to claim 1, wherein said channel optical waveguide is embedded in said slab optical waveguide.

4. An integrated optical device according to claim 1, wherein said device further comprises a light source coupled to one end portion of said channel optical waveguide to input a beam of light to said channel optical waveguide.

5. An integrated optical device according to claim 4, wherein said device further comprises a photodetector coupled to another end portion of said channel optical waveguide to detect a beam of light propagating through said channel optical waveguide, and a feedback control circuit for controlling the output wavelength of said light source in response to the output of said photodetector.

6. An integrated optical device according to claim 1, wherein said device further comprises a photodetector coupled to one end portion of said channel optical waveguide to detect a beam of light propagating through said channel optical waveguide.

7. An integrated optical device according to the claim 1, wherein a width of said channel optical waveguide varies gradually in the longitudinally direction thereof.

8. An integrated optical device according to claim 1, wherein the thickness of said channel optical waveguide varies gradually in the longitudinal direction thereof.

9. An integrated optical device according to claim 1, wherein said grating structure has a grating coefficient that varies along the longitudinal direction of said channel optical waveguide.

10. An integrated optical device according to claim 1, wherein said channel optical waveguide is provided with a plurality of longtitudinally spaced apart grating couplers.

11. An integrated optical device according to claim 1, wherein said channel optical waveguide is provided with a plurality of superimposed multiple grating couplers.

12. An integrated optical device according to claim 1, wherein said slab optical waveguide is provided with a plurality of channel optical waveguides, each of said channel optical waveguides being coupled to said slab optical waveguide at a different region thereof.

13. An integrated optical device according to claim 12, wherein said device has a plurality of light sources each associated with a different one of said plurality of channel optical waveguides.

14. An integrated optical device comprising:
a substrate;
a slab optical waveguide provided on said substrate;
an input-side channel optical waveguide having a thickness and extending in a longitudinal direction, said input-side channel optical waveguide provided at a portion of said slab optical waveguide;
an input-side grating coupler having a grating structure provided at at least one portion of said input-side channel optical waveguide to optically couple said input-side channel optical waveguide and said slab optical waveguide;
an output-side channel optical waveguide provided at another portion of said slab optical waveguide;
an output-side grating coupler having a grating structure provided at at least one portion of said output-side channel optical waveguide to optically couple said slab optical waveguide and said output-side channel optical waveguide; and
a photodetector for detecting light propagating through said output-side channel optical waveguide.

15. An integrated optical device according to claim 14, wherein said gratings which respectively constitute said input-side grating coupler and said output-side grating coupler are symmetrical with each other, and have grating coupling coefficients which are equal.

16. An integrated optical device according to claim 14, wherein said input- and output-side channel optical waveguides are striped protrusions provided on a surface of said slab optical waveguide.

17. An integrated optical device according to claim 14, wherein said input- and output-side channel optical waveguides are each embedded in said slab waveguide.

18. An integrated optical device according to claim 14, wherein said input-side channel optical waveguide is provided with a plurality of input-side grating couplers for selectively coupling light beams of different wavelengths, and said device has a plurality of output-side channel optical waveguides, output-side grating couplers, and photodetectors, each corresponding to one of said input-side grating couplers.

19. An integrated optical device according to claim 18, wherein said plurality of input-side grating couplers are longitudinally spaced apart along said input-side channel optical waveguide.

20. An integrated optical device according to claim 18, wherein said plurality of input-side grating couplers are superimposed.

21. An integrated optical device according to claim 18, wherein the thickness of said input-side channel optical waveguide varies gradually along the longitudinal direction thereof.

22. An integrated optical device according to claim 14, wherein said input-side grating coupler couples beams of light of different wavelengths to said slab optical waveguide, so that directions of propagation thereof are different, and said device having a plurality of output-side channel optical waveguides to which a plurality of output-side grating couplers for selectively coupling beams of light of different directions of propagation are respectively provided, and a plurality of photodetectors each coupled to one of said output-side channel optical waveguides.

23. An integrated optical device according to claim 22, wherein channel width of said input-side channel optical waveguide varies gradually along the longitudinal direction thereof.

24. An integrated optical device according to claim 14, wherein said device further includes means for generating a surface acoustic wave which diffracts a beam of light propagating through said slab optical waveguide, a plurality of output-side channel optical waveguides, a plurality of grating couplers for coupling said diffracted beam of light to different output-side channel optical waveguides in accordance with an angle of diffraction thereof, and a plurality of photodetectors each coupled to one of said output-side channel waveguides.

25. An integrated optical device comprising:
a substrate;
a slab optical waveguide provided on said substrate;
an input-side channel optical waveguide provided at a portion of said slab optical waveguide;
a light source for supplying a beam of light to said input-side channel optical waveguide;
an input-side grating coupler having a grating structure provided at at least one portion of said input-side channel optical waveguide to input a beam of light that has propagated through said input-side channel optical waveguide into said slab optical waveguide;
an output-side channel optical waveguide provided at another portion of said slab optical waveguide;
an output-side grating coupler having a grating structure provided at at least one portion of said output-side channel optical waveguide to output a beam of light, that is input from said input-side channel optical waveguide and propagates through said slab optical waveguide, to said output-side channel optical waveguide; and
a photodetector for detecting a beam of light propagating through said output-side channel optical waveguide.

26. An integrated optical device according to claim 25, wherein said device has a plurality of light sources for emitting light beams of different wavelengths, a plurality of input-side channel optical waveguides for propagating each of said light beams from said light sources, a plurality of input-side grating couplers provided with said input-side channel optical waveguides, respectively, and said output-side channel optical waveguide is provided with a plurality of output-side grating couplers each corresponding to one of said input-side channel optical waveguides.

27. An integrated optical device according to claim 26, wherein a thickness of said output-side channel optical waveguide varies gradually along longitudinal direction thereof.

28. An integrated optical device according to claim 1, wherein said grating coupler is arranged so that an equiphase plane of said grating structure makes an angle other than 90° with respect to the longitudinal direction of said channel optical waveguide.

* * * * *

UNITED STATES PATENT AND TRADEMARK OFFICE
CERTIFICATE OF CORRECTION

PATENT NO. : 4,776,661
DATED : October 11, 1988
INVENTOR(S) : YUICHI HANDA

It is certified that error appears in the above-identified patent and that said Letters Patent is hereby corrected as shown below:

COLUMN 4

Line 20, "dvider;" should read --divider;--.

COLUMN 5

Line 1, "OF" should read --OF--.
Line 49, "K=2π/A," should read --K=2π/Λ,--.
Line 50, "being A." should read --being Λ.--.

COLUMN 7

Line 38, "coefficient κ" should read --coefficient κ --.

COLUMN 9

Line 34, "grating pitch A" should read --grating pitch Λ--

COLUMN 14

Line 59, "longitudinally" should read --longitudinal--.

COLUMN 15

Line 1, "longtitudinally" should read --longitudinally--.

UNITED STATES PATENT AND TRADEMARK OFFICE
CERTIFICATE OF CORRECTION

PATENT NO. : 4,776,661
DATED : October 11, 1988
INVENTOR(S) : YUICHI HANDA

It is certified that error appears in the above-identified patent and that said Letters Patent is hereby corrected as shown below:

COLUMN 16

Line 10, "wherein channel" should read --wherein a channel--.
Line 61, "along longitudinal" should read --along a longitudinal--.

Signed and Sealed this

Eleventh Day of April, 1989

Attest:

DONALD J. QUIGG

Attesting Officer

Commissioner of Patents and Trademarks